(12) United States Patent
Yamaguchi et al.

(10) Patent No.: US 7,782,689 B2
(45) Date of Patent: Aug. 24, 2010

(54) SEMICONDUCTOR INTEGRATED CIRCUIT AND MEMORY CHECKING METHOD

(75) Inventors: Tokushi Yamaguchi, Kyoto (JP); Hiroyuki Sekiguchi, Kanagawa (JP); Ryoji Shiota, Kanagawa (JP); Mitsuya Nakano, Kanagawa (JP)

(73) Assignee: Panasonic Corporation, Osaka (JP)

( * ) Notice: Subject to any disclaimer, the term of this patent is extended or adjusted under 35 U.S.C. 154(b) by 381 days.

(21) Appl. No.: 12/053,944

(22) Filed: Mar. 24, 2008

(65) Prior Publication Data

US 2008/0253208 A1    Oct. 16, 2008

(30) Foreign Application Priority Data

Apr. 11, 2007   (JP)   .......................... P. 2007-103954

(51) Int. Cl.
    *G11C 29/12*   (2006.01)
(52) U.S. Cl. .................. 365/201; 365/200; 365/189.05; 707/899
(58) Field of Classification Search .................. 365/201
    See application file for complete search history.

(56) References Cited

U.S. PATENT DOCUMENTS

| | | | |
|---|---|---|---|
| 6,728,910 B1 * | 4/2004 | Huang | 714/711 |
| 6,734,549 B2 | 5/2004 | Takeoka et al. | |
| 7,036,064 B1 | 4/2006 | Kebichi et al. | |
| 7,146,547 B2 * | 12/2006 | Fukatsu | 714/718 |
| 7,174,489 B2 | 2/2007 | Sadakata et al. | |
| 7,577,885 B2 * | 8/2009 | Hasegawa et al. | 714/718 |
| 7,607,055 B2 * | 10/2009 | Jung et al. | 714/719 |
| 2005/0097418 A1 * | 5/2005 | Anzou et al. | 714/733 |
| 2005/0193293 A1 * | 9/2005 | Shikata | 714/718 |
| 2005/0204239 A1 * | 9/2005 | Miyaji et al. | 714/738 |
| 2005/0219886 A1 * | 10/2005 | Marumoto et al. | 365/45 |
| 2007/0280014 A1 * | 12/2007 | Sekiguchi | 365/200 |

FOREIGN PATENT DOCUMENTS

JP          08-241254          9/1996

* cited by examiner

*Primary Examiner*—Don Wong
*Assistant Examiner*—Binh V Ho
(74) *Attorney, Agent, or Firm*—McDermott Will & Emery LLP

(57) ABSTRACT

The semiconductor integrated circuit includes a memory for storing secret data, a memory BIST circuit for executing a memory. BIST, a first selector for switching between a path for a memory isolation test via an external terminal and a path from the memory BIST circuit, a second selector for switching between a path from the output of the first selector and a path from a normal circuit and having an output coupled to the memory, and a third selector for switching between a path from the output of the memory and a path for receiving a pseudo signal and receiving a check completion signal outputted from the memory BIST circuit as a selection signal. In this semiconductor integrated circuit, after the memory is initialized by executing the memory BIST, the memory can be accessed from the external terminal via the path for the memory isolation test.

5 Claims, 5 Drawing Sheets

SEMICONDUCTOR INTEGRATED CIRCUIT AND MEMORY CHECKING METHOD

BACKGROUND OF THE INVENTION

1. Field of the Invention

The present invention relates to a semiconductor integrated circuit and a method of checking a memory.

2. Description of the Related Art

Conventionally, a semiconductor integrated circuit includes an initialization dedicated circuit for completely initializing secret data. In the case of checking or evaluating a memory for storing the secret data, the accessing to the memory is allowed after the initialization dedicated circuit completely initializes the memory. FIG. 8 is a block diagram showing a semiconductor integrated circuit of the related art. In the semiconductor integrated circuit shown in FIG. 8, in the case of executing an isolation test from an external terminal 241, it is required to initialize a memory 211 by an initializing circuit 213.

Another semiconductor integrated circuit of the related art includes a circuit for determining whether or not an access is allowed thereby to control the access from the outside (see a patent document 1, for example).

Patent Document 1: JP-A-8-241254

However, in the aforesaid semiconductor integrated circuit, in the case of the memory for storing secret data, a test dedicated terminal can not be provided at the outside thereof directly. Thus, when the memory stores the secret data, a test dedicated circuit for initializing the memory is required. However, the initialization dedicated circuit for completely initializing the secret data results in the increase of an area required for the circuits.

Further, in the case of a memory having a redundancy survival function using the laser repair, since the initialization using a dedicated circuit and an individual test using the isolation are required, a time required for the checking becomes long. Further, at the time of the scanning, information of the memory can be outputted to outside by controlling flip-flops at the periphery of the memory.

SUMMARY OF THE INVENTION

An object of the invention is to provide a semiconductor integrated circuit and a method of checking a memory which can initialize a memory without providing an initialization dedicated circuit for initializing the memory and allow the memory to be accessed from the outside only after completely erasing secret data within the memory.

The invention provides a semiconductor integrated circuit, including:

a memory which stores secret data;

a memory BIST circuit which executes a memory BIST with respect to the memory;

a first selector which switches between a path for a memory isolation test executed with respect to the memory via an external terminal and a path from the memory BIST circuit;

a second selector which switches between a path from an output of the first selector and a path from a normal circuit and has an output coupled to the memory; and a third selector which switches between a path from an output of the memory and a path for receiving a pseudo signal and receives a check completion signal outputted from the memory BIST circuit as a selection signal, wherein after the memory is initialized by executing the memory BIST, the memory can be accessed from the external terminal via the path for the memory isolation test.

According to the semiconductor integrated circuit, the memory can be initialized without providing an initialization dedicated circuit for initializing the memory and the memory can be accessed from the outside only after completely erasing secret data within the memory. Thus, a circuit area necessary for the initialization dedicated circuit can be eliminated and the leakage of secret data can be prevented.

The semiconductor integrated circuit further includes another memory that stores dummy data different from the secret data, and the third selector switches between the path from the output of the memory and a path from an output of the another memory.

Thus, even if a normal user tries to access the memory for secret data, since the normal user can merely access the another memory, the leakage of secret data can be prevented.

In the semiconductor integrated circuit, the memory has a redundant area, and the third selector switches between the path from the output of the memory and a path from an output of the redundant area within the memory.

Thus, even if a normal user tries to access the memory for secret data, since the normal user can merely access redundant area, the leakage of the secret data can be prevented. Further, the redundant area can be checked and evaluated.

In the semiconductor integrated circuit, a flip-flop of the normal circuit, a flip-flop of the memory BIST circuit and a flip-flop for observation are disposed on a same scanning chain, and the secret data stored in the memory is rewritten simultaneously with a shift operation at a time of a scanning test.

Thus, when the reading operation is tried by the scanning, which necessarily results in the writing operation to the memory, and so the secret data is rewritten and the leakage of the secret data can be prevented. In this manner, the leakage of the secret data using the scanning chain and the observation flip-flop can be prevented.

The invention provides a method of checking a memory performed by a semiconductor integrated circuit that includes:

the memory which stores secret data;

a memory BIST circuit which executes a memory BIST with respect to the memory;

a first selector which switches between a path for a memory isolation test executed with respect to the memory via an external terminal and a path from the memory BIST circuit;

a second selector which switches between a path from the output of the first selector and a path from a normal circuit and has an output coupled to the memory; and a third selector which switches between a path from the output of the memory and a path for receiving a pseudo signal and receives a check completion signal outputted from the memory BIST circuit as a selection signal, the method includes the step of:

at a time of checking the memory, the checking is performed from the external terminal via the path for the memory isolation test after the memory BIST circuit executes the memory BIST.

Thus, it is unnecessary to initialize secret data stored in the memory before performing the checking by the path for the memory isolation test from the external terminal. Further, at the time of checking the memory, even if a failure is found after performing the checking by the path for the memory isolation test from the external terminal, when the failure can be repaired by using a redundant memory, it is unnecessary to perform the initializing operation dedicated for the secret data stored in the memory. In this manner, since the process of the initialization can be eliminated by initializing the secret data memory using the memory BIST, the checking time can be shortened. Further, the repair of the memory is made possible.

According to the semiconductor integrated circuit and the memory checking method of the invention, secret data can be erased without providing an initialization dedicated circuit for initializing the memory, and the memory can be accessed from the outside only after completely erasing the secret data. Thus, a circuit area necessary for the initialization dedicated circuit can be eliminated and the leakage of secret data can be prevented.

DESCRIPTION OF THE PREFERRED EMBODIMENTS

Hereinafter, the embodiment of the invention will be explained with reference to drawings.

First Embodiment

Figure 1:
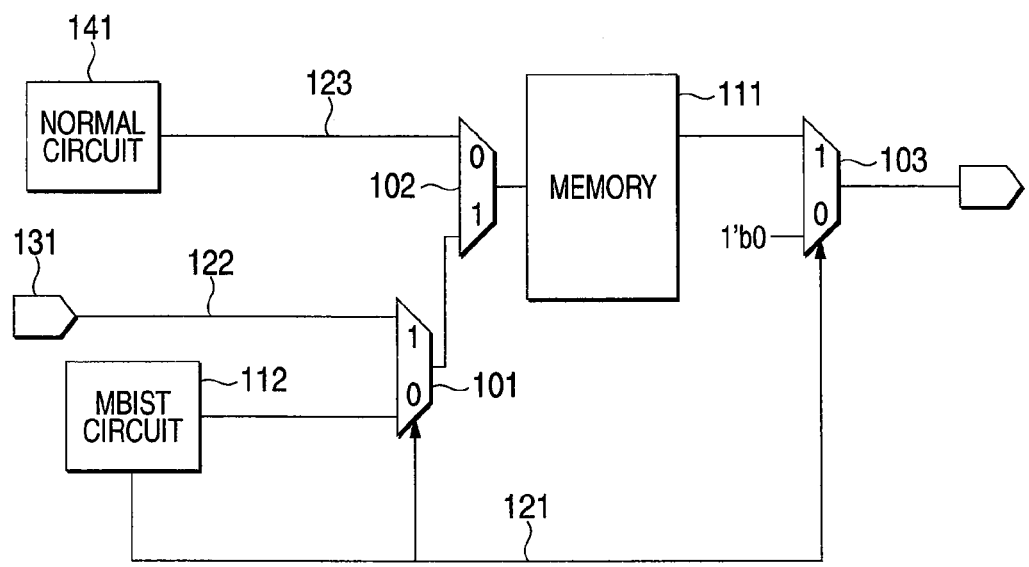
FIG. 1 is a block diagram showing the semiconductor integrated circuit according to the first embodiment.

FIG. 1 is a block diagram showing a semiconductor integrated circuit according to the first embodiment. As shown in FIG. 1, the semiconductor integrated circuit according to the first embodiment includes a first selector 101 for switching between a path from a memory BIST (MBIST) circuit 112 and a direct input path 122 from an external terminal 131, a selector 102 for switching between the direct input path 122 from the external terminal 131 and a path 123 from a normal circuit 141, and a selector 103 for switching between an output path from a memory 111 and a path to which a pseudo signal is inputted. The selector 103 receives a check completion signal 121 from the MBIST circuit 112 as a selection signal. The memory 111 is configured by an SRAM and stores secret data therein.

Figure 2:
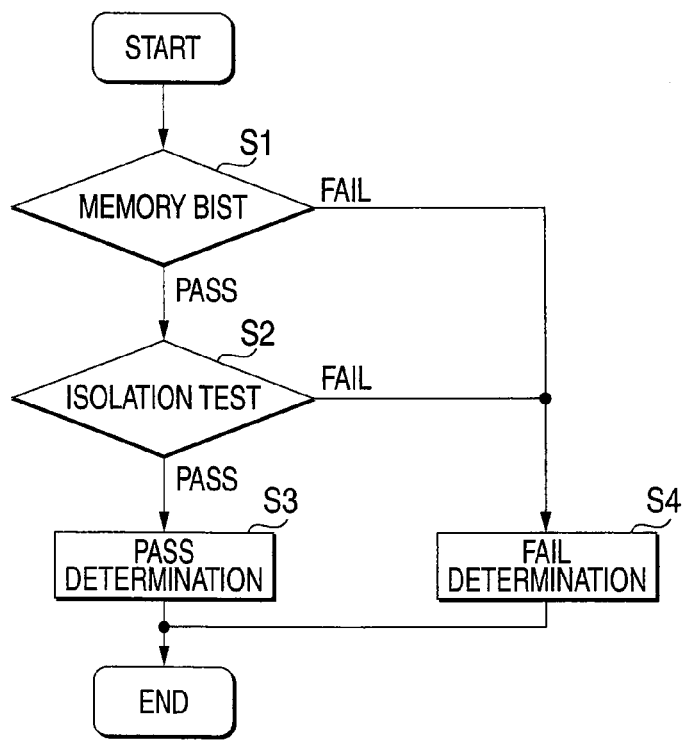
FIG. 2 is a flowchart showing the procedure for checking a memory.

The memory check operation performed by the semiconductor integrated circuit according to the first embodiment will be explained. FIG. 2 is a flowchart showing the memory check procedure. First, the MBIST circuit 112 executes a memory BIST (built in self test) with respect to the memory 111 and determines the result of the test (step S1). When the execution of the memory BIST results in success (PASS), since the memory 111 is initialized, the memory 111 is allowed to be accessed from the external terminal 131. Then, an isolation test is executed as to the memory 111 and the result of the test is determined (step S2). When the isolation test results in success or PASS, a PASS determination is made (step S3) and the test is completed.

On the other hand, when the memory BIST executed in step S1 results in failure (FAIL) or the isolation test executed in step S2 results in failure (FAIL), a FAIL determination is made (step S4) and the test is completed.

According to the semiconductor integrated circuit and the memory checking method performed by the semiconductor integrated circuit according to the first embodiment, an algorithm other than the memory BIST can be inputted from the external terminal. Further, since an operation for only performing the initialization is not necessary, a process for initializing the memory can be eliminated. Thus, the initialization of data can be performed without mounting an initialization dedicated circuit for initialing the memory. Further, after completely erasing secret data, the memory can be checked and evaluated without leaking the secret data. Thus, the test circuits can be reduced to a large extent as compared with the circuit configuration of the related art.

Further, according to the semiconductor integrated circuit of the first embodiment, a third party can not read secret data from the memory storing the secret data, and the memory can not be accessed from the outside until the contents thereof is erased completely at the time of checking or evaluating. Thus, the memory can be initialized without providing the initialization dedicated circuit for initialing the memory, and the read/write accesses to the memory from the outside is made possible only after completely erasing the secret data from the memory. Therefore, an area required for the initialization dedicated circuit can be eliminated and the leakage of secret data can be prevented.

Second Embodiment

In a memory mounting a redundant memory area, in the case where a failure portion is detected in a using memory area, the failure memory can be repaired by utilizing the redundant memory area. The second embodiment shows a case where a secret data memory includes the redundant memory area. Since the configuration of the semiconductor integrated circuit according to the second embodiment is same as that of the first embodiment, portions identical to those of the first embodiment are referred to by the common symbols, with explanation thereof being omitted.

Figure 3:
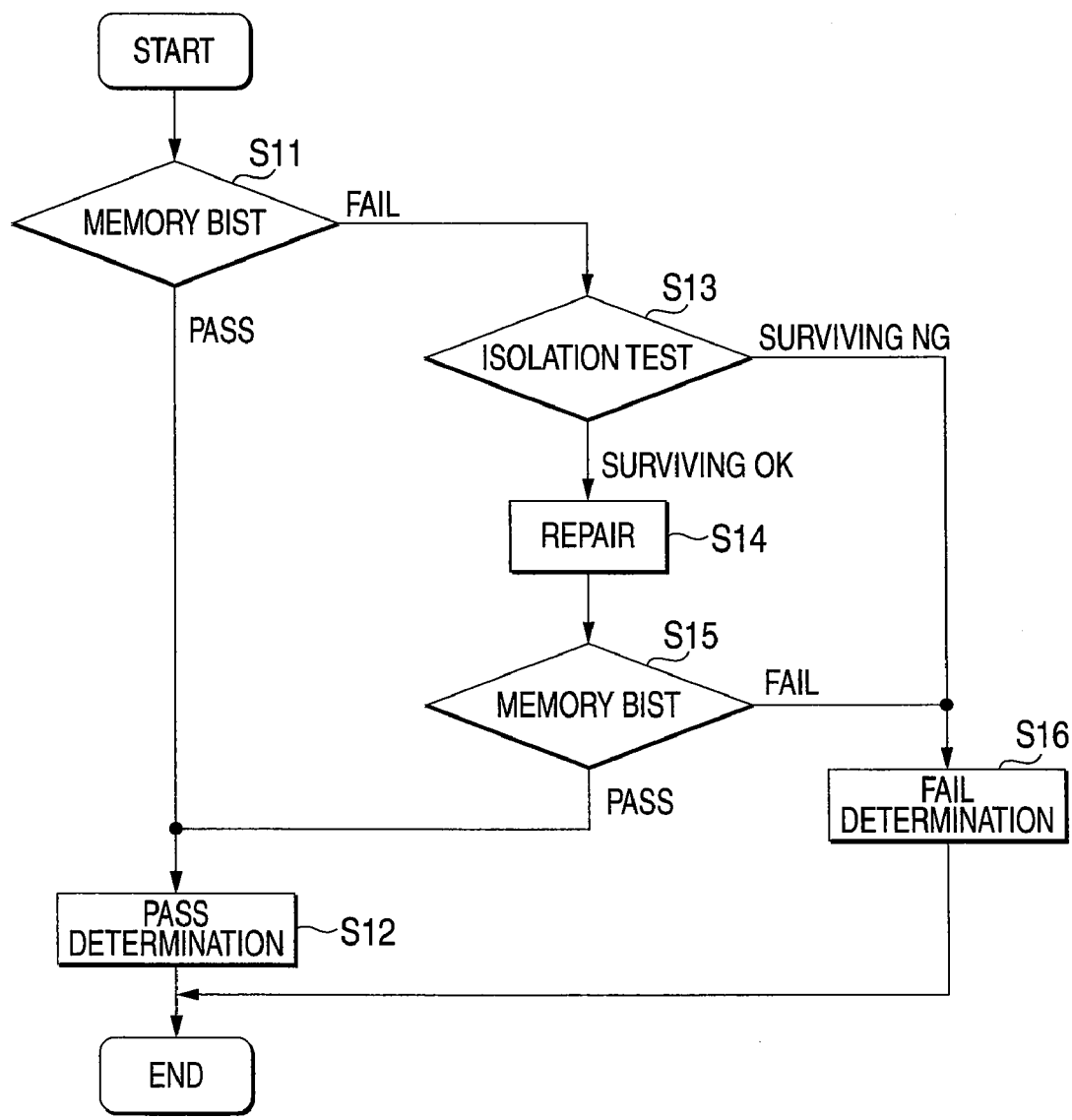
FIG. 3 is a flowchart showing the procedure for checking the memory in the case of repairing the memory.

FIG. 3 is a flowchart showing the memory checking procedure in the case of repairing the memory. First, the MBIST circuit 112 executes the memory BIST (built in self test) with respect to the memory 111 having the redundant memory area and determines the result of the test (step S11). When the execution of the memory BIST results in success (PASS), the PASS determination is made (step S12) and the test is completed.

On the other hand, when the executed memory BIST results in failure (FAIL), the isolation test is executed as to the memory 111 to specify a failure bit or failure bits and it is determined whether or not the memory can be survived (step S13). When it is determined that the surviving is possible as the result of the isolation test, the memory 111 is repaired (step S14). After the repair, the memory BIST is executed again to determine the success (PASS) or failure (FAIL) of the memory operation (step S15). When the execution of the memory BIST results in success (PASS), the PASS determination is made in step S12 and the test is completed.

On the other hand, when it is determined that the surviving is impossible as the result of the isolation test executed in step S13 or when the memory BIST executed in step S15 results in failure (FAIL), the FAIL determination is made (step S16) and the test is completed.

According to the semiconductor integrated circuit of the second embodiment, since the secret data memory can be initialized by using the memory BIST, a process for initializing the memory can be eliminated and memory can be repaired.

Third Embodiment

Figure 4:
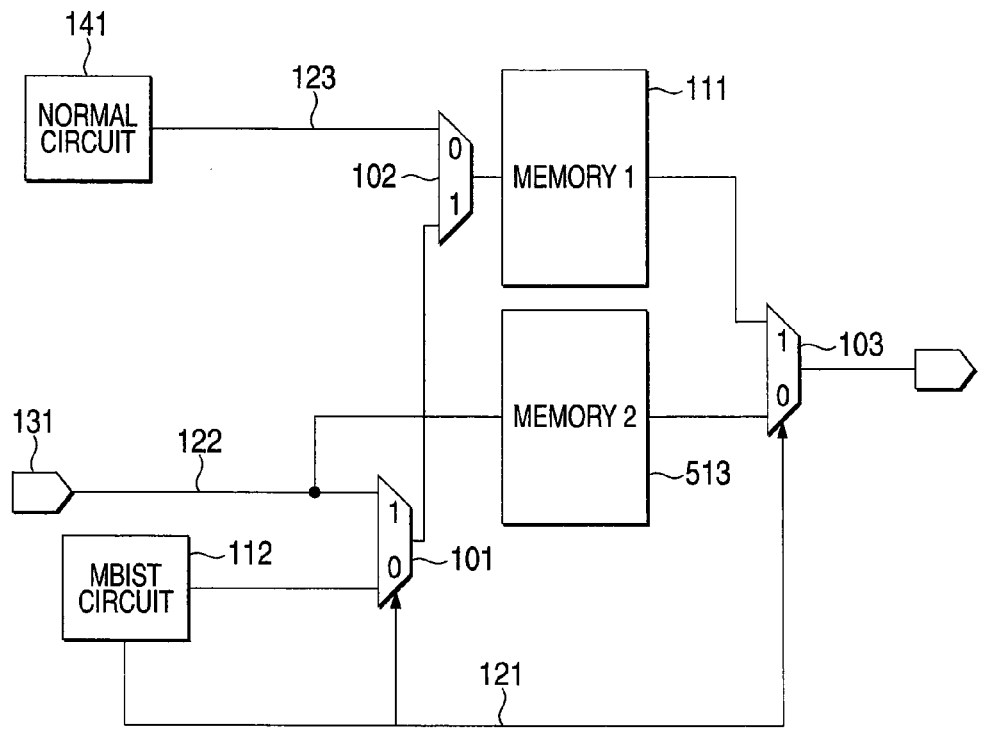
FIG. 4 is a block diagram showing the semiconductor integrated circuit according to the third embodiment.

FIG. 4 is a block diagram showing the semiconductor integrated circuit according to the third embodiment. In the figure, portions identical to those of the first embodiment are referred to by the common symbols, with explanation thereof being omitted. In the semiconductor integrated circuit according to the third embodiment, a memory (pseudo memory) 513 for normal data is mounted separately from the memory 111 for secret data. The selector 103 switches between the output of the memory 111 and the output of the pseudo memory 513.

According to the semiconductor integrated circuit of the third embodiment, at the time of executing the isolation test via the external terminal 131, the selector 103 is switched so that the value of the pseudo memory 513 is outputted until the initialization is completed. Thus, even when a usual user tries to access the secret data memory, since the usual user can access only to the pseudo memory, the leakage of the secret data can be prevented.

Figure 5:
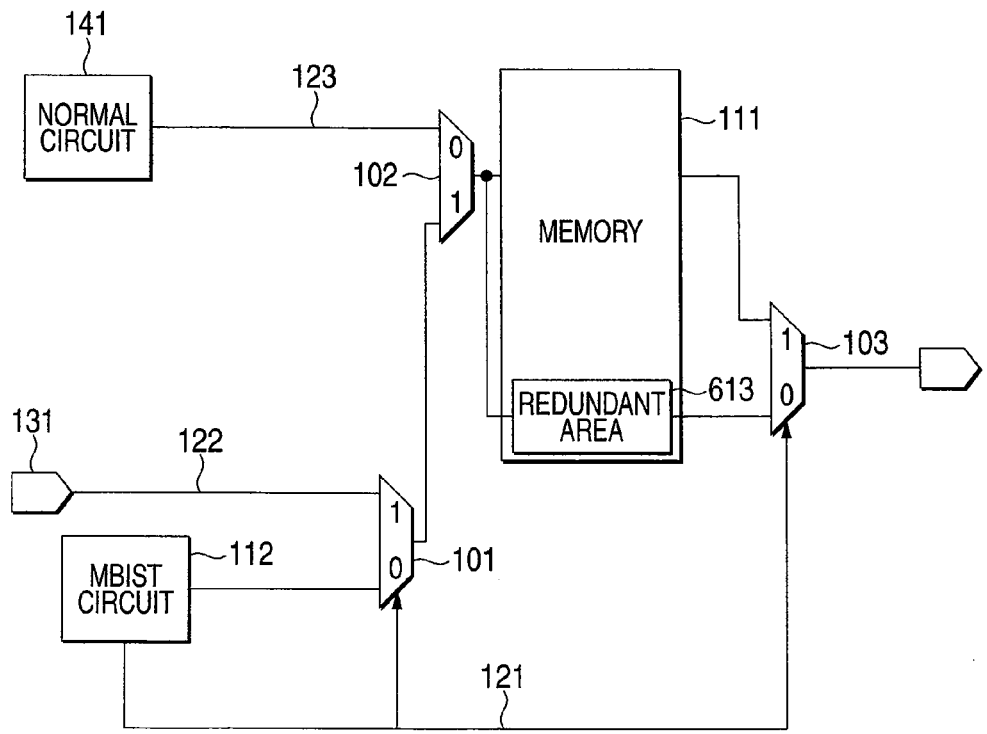
FIG. 5 is a block diagram showing the semiconductor integrated circuit in which a redundant area is mounted on a memory for secret data.

The similar effects can be attained even in the case where a redundant area is mounted in the secret data memory in place of mounting the pseudo memory. FIG. 5 is a block diagram showing the semiconductor integrated circuit in which a redundant area is mounted in the secret data memory. That is, the redundant area 613 is mounted in the secret data memory 111.

According to this semiconductor integrated circuit, at the time of executing the isolation test via the external terminal 131, the selector 103 is switched so that the value of the redundant area 613 is outputted until the initialization is completed. Thus, even when a usual user tries to access the secret data memory, since the usual user can access only to the redundant area 613, the leakage of the secret data can be prevented. Therefore, it becomes possible to check and evaluate the redundant area.

Fourth Embodiment

Figure 6:
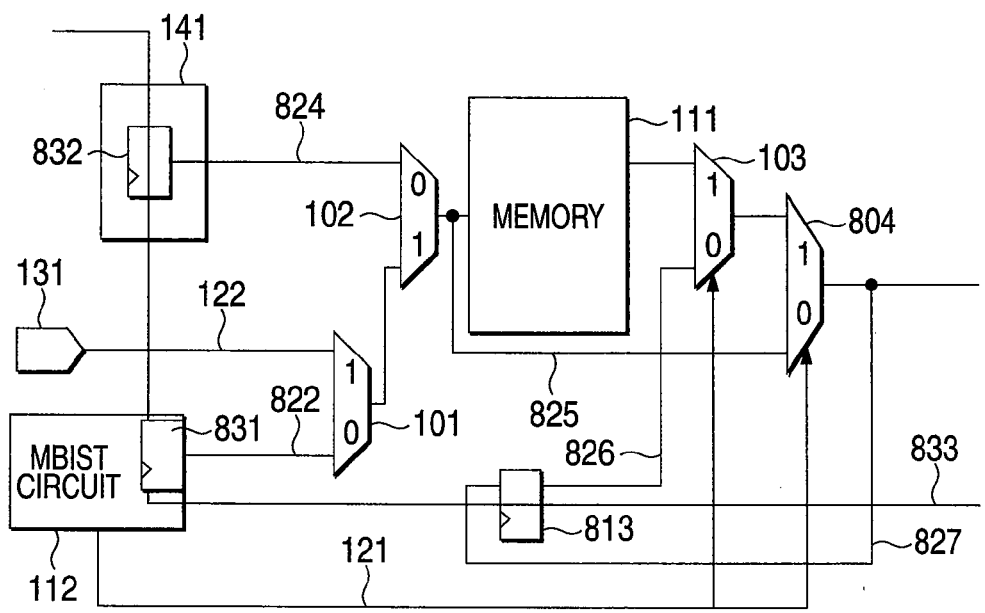
FIG. 6 is a block diagram showing the semiconductor integrated circuit according to the fourth embodiment.

FIG. 6 is a block diagram showing the semiconductor integrated circuit according to the fourth embodiment. In the figure, portions identical to those of the first embodiment are referred to by the common symbols, with explanation thereof being omitted. The semiconductor integrated circuit according to the fourth embodiment further includes, in addition to the configuration of the first embodiment, a fourth selector 804 for switching between the output of the selector 103 and the output of the selector 102, a SCAN observation/control flip-flop 813 and a SCAN (scanning) chain 833.

A representative flip-flop 831 within the MBIST circuit 112, a representative flip-flop 832 within the normal circuit 141 and the SCAN observation/control flip-flop 813 are coupled to the SCAN chain 833.

In the figure, 824 depicts a path from the normal circuit 141, 825 depicts a path bypassed at the time of the scanning, 826 depicts a control signal from the SCAN observation/control flip-flop 813, and 827 depicts an observation signal sent to the SCAN observation/control flip-flop 813.

In the semiconductor integrated circuit thus configured, information of the secret data memory 111 can be read via the usual scanning path by using the SCAN observation/control flip-flop 813 and the representative flip-flop 832 within the normal circuit 141.

Figure 7:
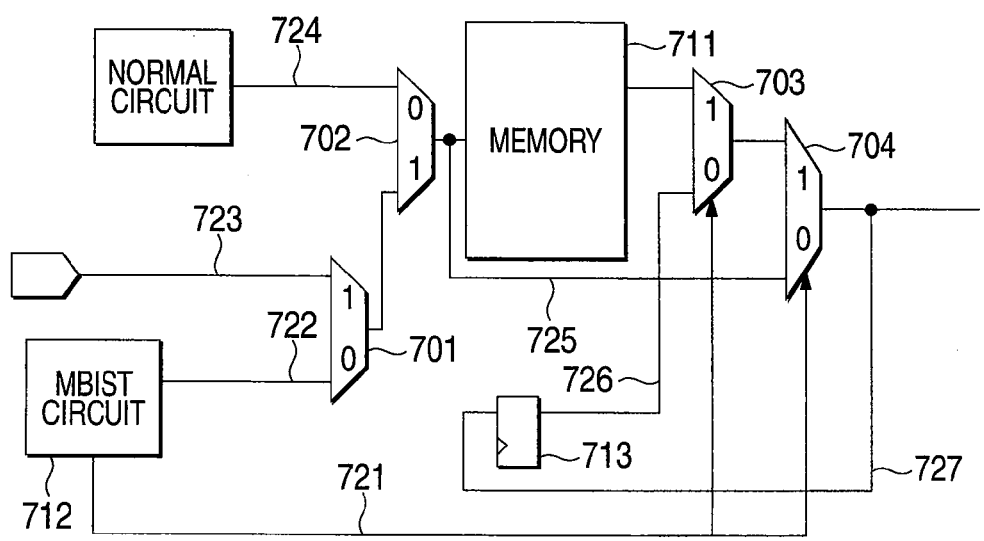
FIG. 7 is a block diagram showing another semiconductor integrated circuit.
Figure 8:
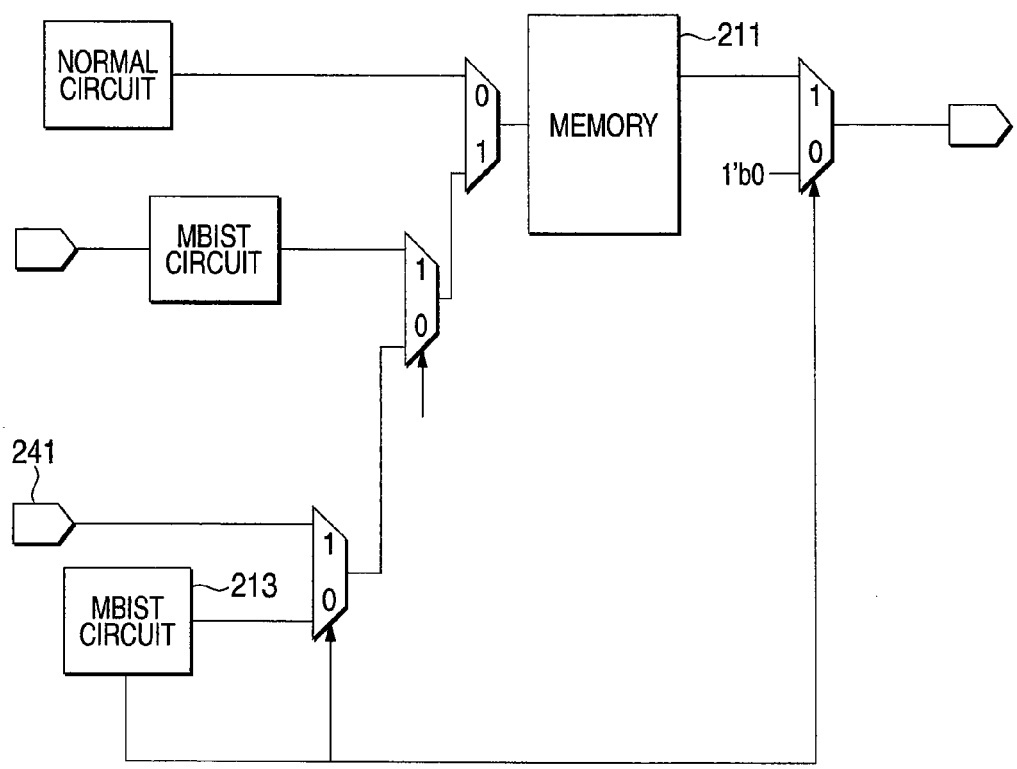
FIG. 8 is a block diagram showing a semiconductor integrated circuit of the related art.

The operation of the semiconductor integrated circuit of this embodiment will be explained in comparison with the operation of another semiconductor integrated circuit. FIG. 7 is a block diagram showing the another semiconductor integrated circuit. In this figure, 701 depicts a first selector, 702 depicts a second selector, 703 depicts a third selector, 704 depicts a fourth selector, 711 depicts a secret data memory, 712 depicts an MBIST circuit, 713 depicts a SCAN (scanning) observation/control flip-flop, 721 depicts a selector control signal, 722 depicts a control signal from the MBIST circuit, 723 depicts a direct input path from the external terminal, 724 depicts a path from the normal circuit, 725 depicts a path bypassed at the time of the scanning, 726 depicts a control signal from the SCAN observation/control flip-flop, and 727 depicts an observation signal sent to the SCAN observation/control flip-flop.

In the another semiconductor integrated circuit, the SHIFT (shift) operation of the SCAN chain is used in order to set the address of the memory 711 to a value desired for reading. First, the shift-in is performed in order to set a value to the flip-flop for controlling the path 724. Similarly, the shift in is performed in order to control the first selector 701 and the second selector 702. Next, similarly, the flip-flop within the MBIST circuit 712 is controlled in order to control the third selector 703 and the fourth selector 704 by utilizing the SHIFT operation of the SCAN chain. That is, the selector control signal 721 from the MBIST circuit 712 is controlled to change the direction of each of the third selector 703 and the fourth selector 704. Then, the flip-flop 713 fetches a desired value from the memory 711. The value thus fetched is shifted out (SHIFT OUT) to the outside by again utilizing the SHIFT operation of the SCAN chain. In this manner, the information within the memory 711 can be read.

The reason-why the information cab be read by the aforesaid method in the another semiconductor integrated circuit is that since the flip-flop 713, the flip-flop on the path 724, the flip-flop controlled by the first selector 701 and the second selector 702, and the flip-flop within the MBIST circuit 712 exist on the different SCAN chains, these flip-flops can be controlled separately. In other words, the operation for setting an intended address value to the memory 711 and the operation for fetching the value at the flip-flop 713 can be performed independently with being influenced to each other.

In view of this fact, the semiconductor integrated circuit according to this embodiment is configured in a manner that the representative flip-flop 832 on the path 824, the representative flip-flop 831 within the MBIST circuit 112 for generating the selector control signal 121 and the flip-flop 813 capable of fetching the value of the memory 111 are coupled to the same SCAN chain.

According to this configuration, in the case of trying such an operation by utilizing the SCAN chain that the path 824 is changed to an intended (desired) address value, or the directions of the selector 102 and the selector 101 are changed, or the value of the flip-flop 831 within the MBIST circuit 112 is changed to control the directions of the selector 103 and the selector 104, this operation may succeed at the first time. However, the random address write-enable control is caused according to the shift-out operation of the value fetched at the first time and so there arises an operation of writing another value in the memory 111. Thus, hereinafter, it is expected that the secret data does not remain in the memory 111. In the SHIFT IN operation, by shifting the value to the direction from the flip-flop 813 to the flip-flop 832 via the flip-flop 831, it is expected that the values of the flip-flops 831 and 832 change randomly by the value fetched by the flip-flop 813 itself.

In this manner, according to the semiconductor integrated circuit of the fourth embodiment, the representative flip-flop 831 within the MBIST circuit 112 is coupled to the SCAN observation/control flip-flop 813 on the SCAN path. Thus, when the reading operation is tried by the scanning, which necessarily results in the writing operation to the memory 111, and so the secret data is written and the leakage of the secret data can be prevented.

The semiconductor integrated circuit according to the invention can initialize the memory without having a dedicated circuit for initializing the memory and is useful as a semiconductor integrated circuit etc. capable of being accessed to the memory from the outside.

What is claimed is:

1. A semiconductor integrated circuit, comprising:
   a memory which stores secret data;
   a memory BIST circuit which executes a memory BIST with respect to the memory;
   a first selector which switches between a path for a memory isolation test executed with respect to the memory via an external terminal and a path from the memory BIST circuit;
   a second selector which switches between a path from an output of the first selector and a path from a normal circuit and has an output coupled to the memory; and
   a third selector which switches between a path from an output of the memory and a path for receiving a pseudo signal and receives a check completion signal outputted from the memory BIST circuit as a selection signal,
   wherein after the memory is initialized by executing the memory BIST, the memory can be accessed from the external terminal via the path for the memory isolation test.

2. The semiconductor integrated circuit according to claim 1, further comprising:
   another memory which stores dummy data different from the secret data, wherein the third selector switches between the path from the output of the memory and a path from an output of the another memory.

3. The semiconductor integrated circuit according to claim 1, wherein the memory has a redundant area, and the third selector switches between the path from the output of the memory and a path from an output of the redundant area within the memory.

4. The semiconductor integrated circuit according to claim 1, wherein a flip-flop of the normal circuit, a flip-flop of the memory BIST circuit and a flip-flop for observation are disposed on a same scanning chain, and the secret data stored in the memory is rewritten simultaneously with a shift operation at a time of a scanning test.

5. A method of checking a memory performed by a semiconductor integrated circuit, which includes:
   the memory which stores secret data;
   a memory BIST circuit which executes a memory BIST with respect to the memory;
   a first selector which switches between a path for a memory isolation test executed with respect to the memory via an external terminal and a path from the memory BIST circuit;
   a second selector which switches between a path from the output of the first selector and a path from a normal circuit and has an output coupled to the memory; and
   a third selector which switches between a path from the output of the memory and a path for receiving a pseudo signal and receives a check completion signal outputted from the memory BIST circuit as a selection signal, the method comprising the step of:
   at a time of checking the memory, the checking is performed from the external terminal via the path for the memory isolation test after the memory BIST circuit executes the memory BIST.

\* \* \* \* \*